United States Patent [19]

Roberts et al.

[11] Patent Number: 5,302,958
[45] Date of Patent: Apr. 12, 1994

[54] LOW LOSS, FAST SWITCHING, TUNABLE FILTER CIRCUIT

[75] Inventors: Roger G. Roberts, Auburn; Paul R. Cox, Duluth, both of Ga.

[73] Assignee: EMS Technologies, Inc., Norcross, Ga.

[21] Appl. No.: 929,529

[22] Filed: Aug. 14, 1992

Related U.S. Application Data

[63] Continuation-in-part of Ser. No. 910,442, Jul. 8, 1992, abandoned.

[51] Int. Cl.⁵ .............................................. G01S 13/00
[52] U.S. Cl. ................................... 342/157; 333/174; 333/205; 333/235
[58] Field of Search .............. 333/109, 110, 116, 17.1, 333/174, 175, 219, 235, 202, 205; 342/157, 368

[56] References Cited

U.S. PATENT DOCUMENTS

| | | | |
|---|---|---|---|
| 3,074,033 | 1/1963 | Smith | 333/110 |
| 4,121,182 | 10/1978 | Makimoto et al. | 333/116 X |
| 4,450,417 | 5/1984 | Folkmann | 333/174 X |
| 4,724,441 | 2/1988 | Fithian et al. | 342/368 |
| 4,758,800 | 7/1988 | DiBiase et al. | 333/219 X |

*Primary Examiner*—Paul Gensler
*Attorney, Agent, or Firm*—Nixon & Vanderhye

[57] ABSTRACT

A low loss, fast switching, electronically tunable filter circuit which is microstrip compatible is obtained through the use of a resonant ring structure having two couplers, a low noise amplifier and a variable phase shifter. The tunable filter may advantageously be used in the receive channel of a transmit/receive module for phased arrays wherein the resonant frequency of the ring can be tuned anywhere in the operating frequency range so as to increase the dynamic range of the receiver.

31 Claims, 9 Drawing Sheets

LOW LOSS, FAST SWITCHING, TUNABLE FILTER CIRCUIT

This is a continuation-in-part of application Ser. No. 07/910,442, filed Jul. 8, 1992, now abandoned.

FIELD OF THE INVENTION

The invention relates generally to tunable filters. More particularly, it concerns low loss, microstrip compatible, electronic tunable bandpass or band rejection filters. As disclosed herein, such filters have special utility for extending the dynamic range and providing receiver protection in RF transmitter/receiver modules used in phased arrays.

RELATED PATENTS AND APPLICATIONS

This application is related to the following commonly assigned U.S patents and patent applications:
U.S. Pat. No. 4,445,098—Sharon et al (1984)
U.S. Pat. No. 4,884,045—Alverson et al (1989)
U.S. Pat. No. 5,075,648—Roberts et al (1991)
Roberts U.S. Ser. No. 07/669,883, filed Mar. 14, 1991, "Planar Substrate Ferrite/Diode Phase Shifter for Phased Array Applications", now U.S. Pat. No. 5,144,319 issued Sep. 1, 1992.
Roberts et al U.S. Ser. No. 07/795,026, filed Nov. 20, 1991, "Polarization Agility in an RF Radiator Module for Use in a Phased Array", now U.S. Pat. No. 5,304,999 issued Apr. 19, 1994.

The entire contents of the above listed patents and patent applications are hereby incorporated by reference.

BACKGROUND AND SUMMARY OF THE INVENTION

Planar phased arrays of RF radiators wherein each radiator is capable of transmitting and receiving RF electromagnetic signals are generally well known. Such controllable radiators ideally have minimum size, weight, cost and complexity along with low insertion loss, temperature stability, phase accuracy, low drive power requirements, etc.

Proper spacing and control of the relative phasing and amplitude or attenuation of the radiator signals allows the production of a precisely defined overall radiation pattern whereby a well defined beam may be electronically pointed and shaped by way of digital control signals supplied by way of an array controller/computer.

Typical uses of such phased arrays may be found in airborne or land-based radar systems operable in the upper frequency ranges, such as the S, C, X- and K-bands. Such uses require high performance RF transmitter/receiver (T/R) or radiator modules wherein the aforementioned insertion loss, phase accuracy and switching time, as well as bandwidth, switching power and, of course, costs are critical.

As indicated in copending U.S. patent application Ser. No. 07/795,026 referenced above, conventional active T/R modules for use in phased arrays may be of many different types. FIG. 1 of the present application schematically illustrates a typical such module with separate transmit/receive feed ports 1 and 2, respectively. The transmit leg may typically include a phase shifter 3 and controllable attenuator 4 along with a relatively high power amplifier 5 connected to a standard microstrip circulator 6 by way of line 7 for communicating RF signals to antenna 8. As to the receive leg, microstrip line 9 communicates RF signals to transmit/receive limiter 10, low noise amplifier 11, controllable attenuator 12 and a phaser 13, which in turn is connected to the output port 2.

Appropriate phase and amplitude settings of the radiators of the phased array wherein there are typically 2000 such elements may be determined by an array controller/computer (not illustrated) for setting the phase shifters, for example, at desired relative phase shifts for both transmitting and receiving purposes. Moreover, the appropriate radiation pattern shape, pointing angle, etc., may be obtained without any mechanical movement of the array or movement of the radiator elements.

Although improvements continue to be obtained in the art, still further improvements are required for many applications. For example, problems continue to exist in T/R modules, such as power consumption, heat removal, receiver protection, receiver dynamic range and, of course, cost.

Of particular note is the limited dynamic range of existing transmit/receive modules which present a problem due to the third order intermodulation products produced by the low noise amplifier (LNA). Such third order intermodulation productions are considered to be the most troublesome since they fall within the bandpass of even moderate bandwidth amplifiers. That is to say, a typical T/R module circuit, as illustrated in FIG. 1, may have a respectable receiver dynamic range of 100 dB when operating in a spurious free environment. For the spurious free case the dynamic range of a receiver is usually defined as the range from the 1 dB gain compression point of the LNA to the system noise level. However, when operating in spurious environment, such as where aircraft are flying in formation or in a vicinity with radars operating in the same frequency band, the dynamic range of the receiver may be significantly reduced due to the noted third order intermodulation products produced by the low noise amplifier. The dynamic range in a spurious environment is usually defined as the range from the 1 dB gain compression point to the interfering spurious level of the receiver.

We have discovered a unique technique for obtaining a digital latching bandpass filter utilizing a resonant ring circuit which is low loss, fast switching and microstrip compatible. We have further discovered that such electronically tunable bandpass filters may be used in conjunction with the low noise amplifier (LNA) to increase the dynamic range of the receiver in active T/R modules for phased arrays.

In this regard our tunable bandpass filter may be implemented using a resonant ring structure including two couplers, an LNA and a phase shifter wherein the phase shifter may have up to 360° of phase shift, and the resonant frequency of the ring can be tuned anywhere in the operating frequency range. In many applications less than 360° of phase shift will be required because of the limited tuning bandwidth necessary. The ring structure disclosed in more detail below may be used to replace the LNA of FIG. 1. Moreover, the resonant ring filter functions so that the input signal coupled to the ring and the signal progressing around the ring constructively interfere at the input of the LNA when the ring is resonant. The second coupler is used to couple the output signal which has the bandpass characteristic of the ring, and a rejection of off-frequency spurious signals will occur due to the passband response of the filter. In this manner, the third order intermodulation products will be reduced by a factor of 3 times the filter rejection.

Additionally, if desired, our resonant ring structure may be used as a band rejection filter if the output port is selected to be the port loaded on the input coupler. In this regard, at resonance and with proper parameter selection the power would be reinforced in the ring and the power at the output port reduced.

Still further, although the herein disclosed tunable filter can easily obtain a single passband response over desired bands, multiple passband responses may occur depending upon the electrical length of the loop and the required operating bandwidth. We have discovered that if larger operating bandwidths are necessary and the electrical length or insertion phase of the ring structure cannot be reduced to eliminate the multiple responses, such responses may be eliminated through the use of an additional stage in which the electrical length of the loop is different than the first.

Receiver protection advantages may be also be obtained by our tunable filter since the T/R limiter and LNA are placed in the ring structure and are decoupled from the antenna. Thus, off resonance signals are terminated in a load. Additionally, reflection from the T/R limiter back to the antenna is significantly reduced and, therefore, reflection uniformity for low RCS (radar cross section) applications is considerably improved. The limiter and LNA are also less susceptible to burn-out from spurious signals. Furthermore, if desired, the ring can be de-tuned either with the phase shifter or LNA to thus offer still further protection of the T/R limiter and LNA against the high powered amplifier during the transmit pulse.

As a still further application of our tunable filter, if desired, the receiver output port may be switchably connected to a path providing a filtered response from the active filter when in a spurious environment or connected to a path excluding the active filter when operating in a broad band, spurious free environment. As a still further variation of the latter alternative, if the filter remains energized and tuned to a single tone spurious signal, a band rejection within the broad band would exist.

BRIEF DESCRIPTION OF THE DRAWINGS

These as well as other objects and advantages of our invention will be better appreciated by careful study of the following detailed description of exemplary embodiments taken in conjunction with the accompanying drawings in which.

DETAILED DESCRIPTION OF EXEMPLARY EMBODIMENTS

Figure 1:
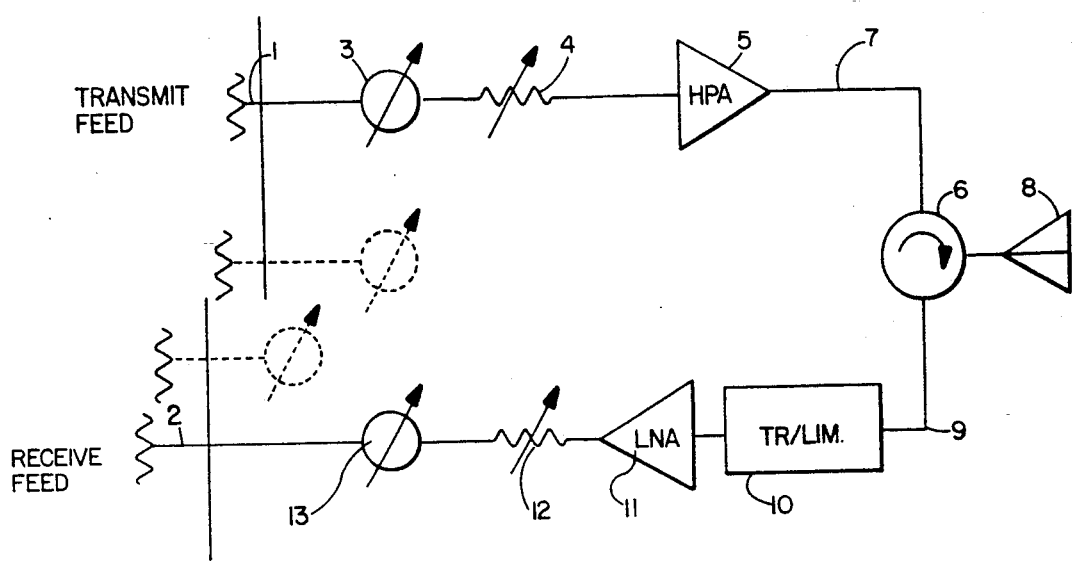
FIG. 1 is a schematic illustration of a typical prior art T/R module with separate transmit/receive ports.
Figure 2:
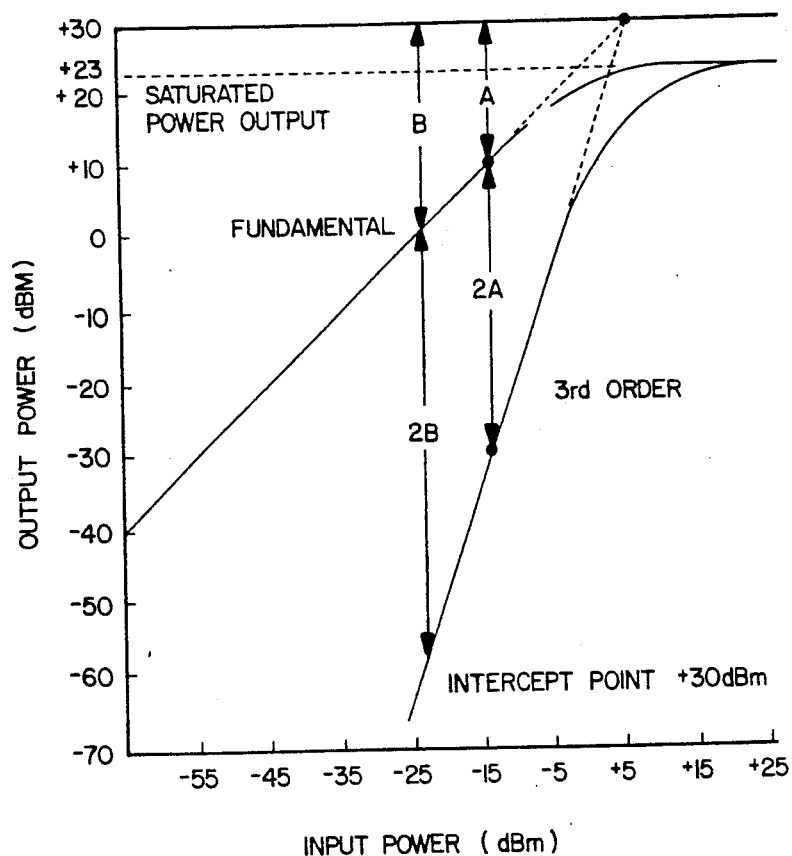
FIG. 2 is a typical amplifier response curve illustrating the effect of third order intermodulation products.

As depicted in FIG. 2, a typical amplifier response illustrating the fundamental input power versus output power response is plotted on a log-log scale and as illustrated will have a 1:1 slope in the linear operating region. Additionally illustrated is the third order intermodulation products response having a 3:1 slope. As previously noted, the third order spurious products of an amplifier such as the LNA of FIG. 1 are the most troublesome since they fall within the bandpass of even moderate bandwidth amplifiers.

As will be appreciated by the artisan, the third order intercept point is generally defined as the point where extensions of the first and third order linear responses intersect on the output power scale. Additionally, the 1 dB gain compression is that point where the output power increase is 1 dB less than the increase in input power. That is to say, the amplifier gain is decreased by 1.0 dB.

The concept illustrated in FIG. 2 is that when the amplifier is operating in the linear amplification range below the 1 dB gain compression point, the levels of the spurious responses can be estimated accurately with a simple equation. For example, if the output power is at +10 dBm and the intercept point is +30 dBm, a difference of 20 dB, then the third order intermodulation products will be 40 dB down or at −30 dBm. Since the difference between the slope of the third order response and the fundamental is 2:1, the third order products will be twice the distance down from the fundamental signals as the fundamental is from the intercept point. If the amplifier having characteristics such as in FIG. 2, is driven to an output power of 0 dBm or 30 dB down from the intercept point, the third order spurious products will be at −60 dBm.

As shown in the above example, for a two tone signal, of equal amplitude, if the third order intercept is increased by X dB, then the third order intermodulation products will be decreased by 2× dB. In contrast, if the filter decreases the signals by X dB, the third order intermodulation products will be reduced by 3× dB. This shows the importance of incorporating a filter to reduce the third order intermodulation products for increasing receiver dynamic range.

Our solution to the problem involves the unique technique of obtaining a tunable filter to be used in place of an amplifier such as the low noise amplifier 11 of FIG. 1 so as to increase the receiver dynamic range in a spurious environment.

More specifically, for use in a typical transmit/receive (T/R) module for phased arrays, as illustrated in FIG. 1, we have found that the dynamic range of the T/R module may be increased through the use of a low loss, digital latching bandpass filter utilizing a resonant ring structure. Such a circuit may be of the nature illustrated in FIG. 3, which comprises two couplers ($C_1$ and $C_2$), a transmit/receive limiter (30), a low noise amplifier 31 and a phase shifter (32).

The phase shifter 32 may advantageously be a digital latching hybrid mode phase shifter of the nature described by Roberts et al in the above cited U.S. Pat. No. 5,075,648. As used herein, the resonant frequency of the ring structure can be tuned anywhere in the operating frequency range by the phase shifter, which may require up to 360° of phase shift. Coupler $C_1$ is used to couple energy to the ring, and when the ring is resonant the signal from coupler $C_1$ along with the signal progressing around the ring constructively interfere at the input of the amplifier 31. The output signal, which has the bandpass characteristic of the ring, is thereafter coupled from the ring by way of coupler $C_2$.

Figure 3:
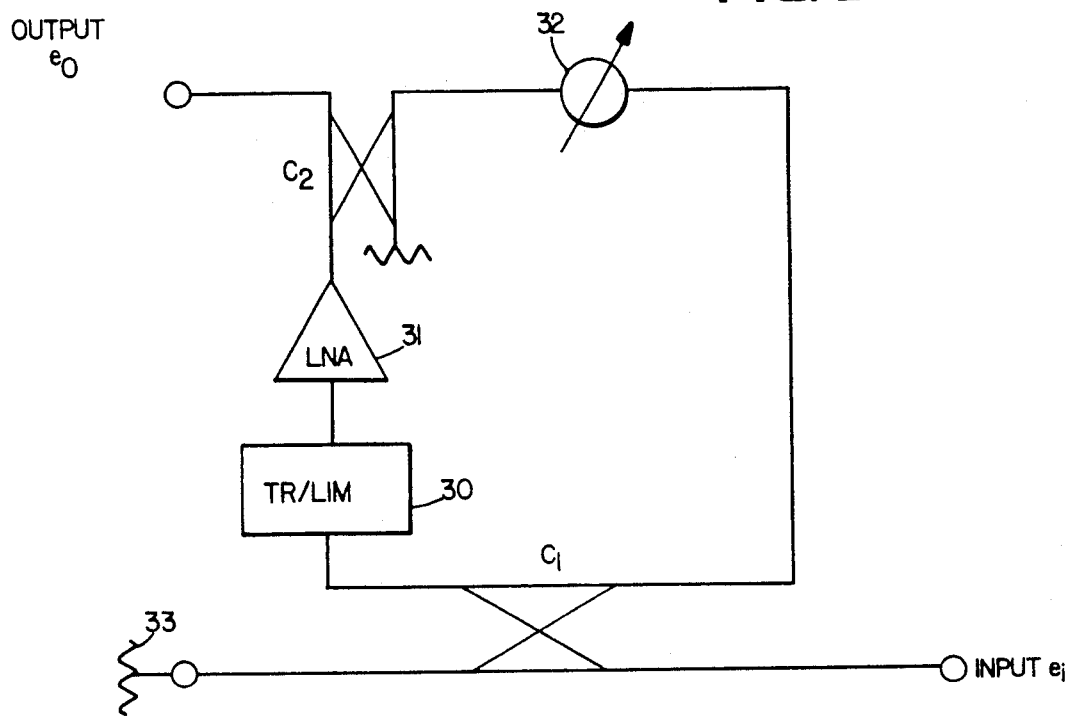
FIG. 3 is a schematic illustration of the tunable bandpass filter of the present invention.

In the illustrated circuit, the gain of the LNA 31 is used to overcome the circuit losses of the ring and the loss of coupler $C_2$. As will be appreciated by the artisan, the important factor of the circuit is that the gain of the LNA is to be less than the coupling and circuit losses of the ring, since otherwise oscillation will occur. Additionally, FIG. 3 schematically illustrates the ring structure coupled to the input $e_i$ via the coupled path of coupler $C_1$ and the direct path of $C_1$ going from input $e_i$ to load 33. As will be recognized by the skilled person in the art, the selected coupling value of $C_1$ can vary greatly depending on the particular application of the exemplary embodiments.

Figure 3A:
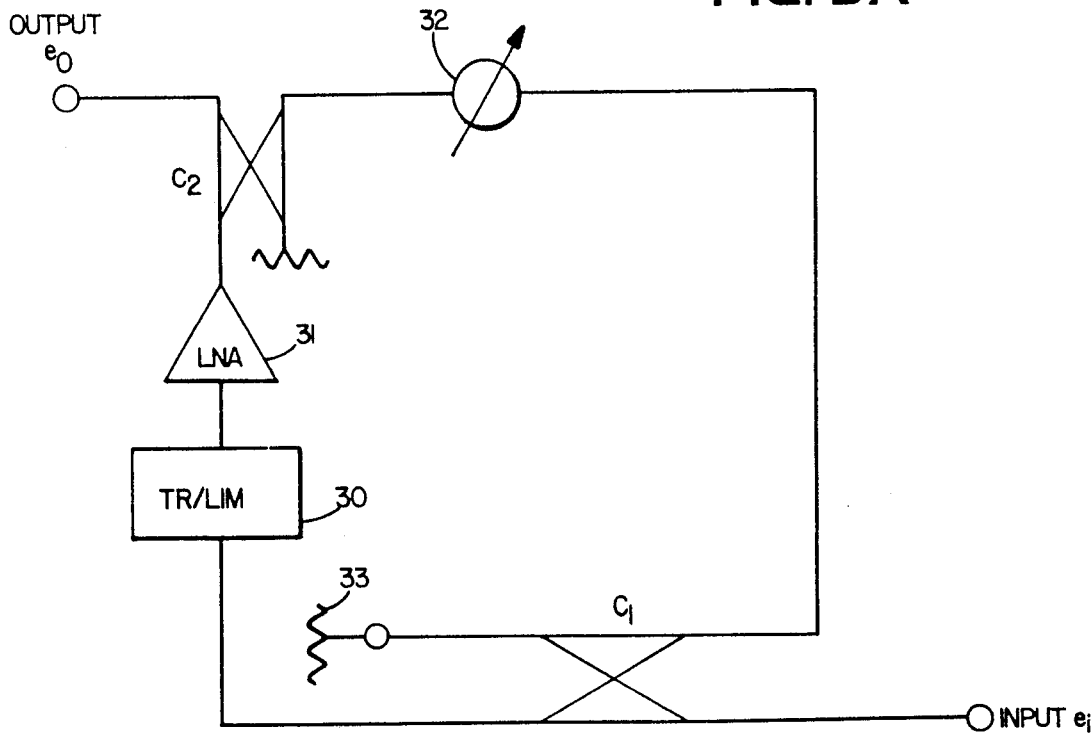
FIG. 3A is a schematic illustration of a modified form of the tunable bandpass filter of FIG. 3 which provides an improved noise figure.

As will also be appreciated by those skilled in the art, FIG. 3A illustrates a modification of the FIG. 3 circuit, which with proper component selection will provide the lowest and most stable noise figure. The general nature of the circuit elements is the same in FIGS. 3 and 3A. However, in FIG. 3A the direct path of coupler $C_1$ is used to connect input $e_i$ to the T/R limiter and amplifier; whereas, the coupled path of $C_1$ is connected to the load 33. Appropriate selection of components and values including coupler values for a particular application will provide optimum signal to noise response.

Figure 4:
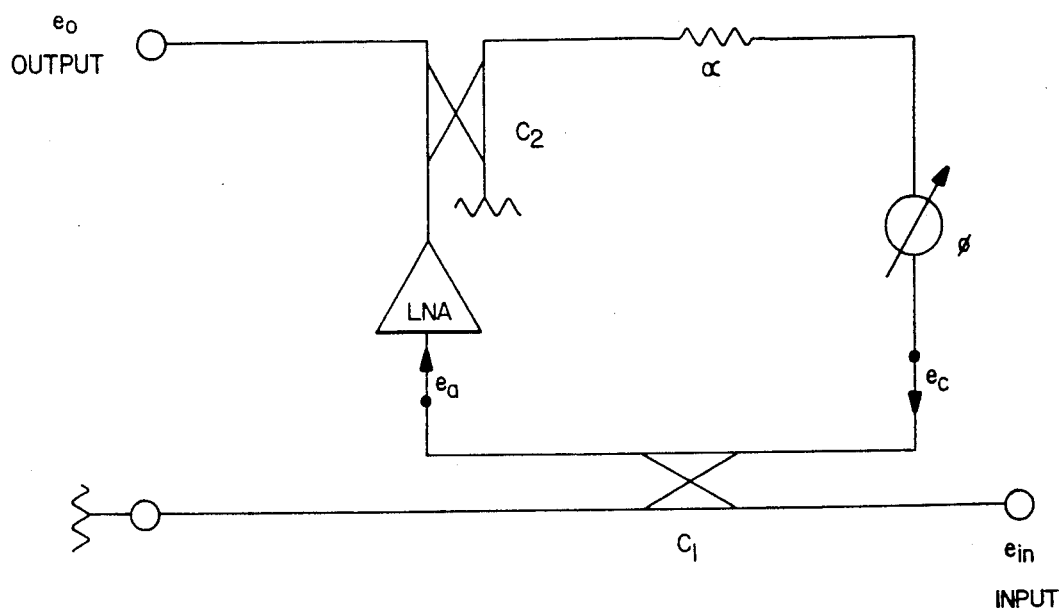
FIG. 4 is a schematic illustration of an equivalent filter circuit used for analysis of the tunable filter circuit of FIG. 3.

For ease of analysis, an equivalent circuit of FIG. 3 is shown in FIG. 4 with the insertion loss of the ring illustrated as $\alpha$ and the circuit parameters as follows:
$e_i$ = input voltage
$e_o$ = output voltage
$C_1$ = coupling value of $C_1$
$C_2$ = coupling value of $C_2$
$G_{LNA}$ = gain of low noise amplifier
$\alpha$ = insertion loss of ring
100 = differential phase shift of phase shifter
$\beta 1$ = electrical length of ring $$e_a = \sqrt{1 - C_1^2}\, e_c + C_1/90\, e_i \tag{1}$$

$$e_o = G_{LNA}\sqrt{1 - C_2^2}\, e_a, \quad e_a = \frac{1}{G_{LNA}\sqrt{1 - C_2^2}}\, e_o \tag{2}$$

$$e_c = \alpha G_{LNA} C_2 e_a / 90 + \phi + \beta 1 \tag{3}$$

From equations (1) and (2):

$$e_o = \tag{4}$$

$$G_{LNA}\sqrt{1 - C_1^2}\,\sqrt{1 - C_2^2}\, e_c + G_{LNA} C_1 \sqrt{1 - C_2^2}\,/90°\, e_i$$

$$e_c = \frac{\alpha C_2/90° + \phi + \beta 1}{\sqrt{1 - C_2^2}}\, e_o \tag{5}$$

From equations (4) (5):

$$e_o = [G_{LNA}\alpha C_2 \sqrt{1 - C_1^2}\,/90° + \phi + \beta 1]\, e_o + \tag{6}$$

$$[G_{LNA} C_1 \sqrt{1 - C_2^2}\,/90°]\, e_i$$

$$\frac{e_o}{e_i} = \tag{7}$$

$$\frac{G_{LNA} C_1 \sqrt{1 - C_2^2}\,/90°}{1 - [G_{LNA}\alpha C_2 \sqrt{1 - C_1^2}]/90° + \phi + \beta 1} = G_c = \text{circuit gain}$$

As shown in equation (7), if the product $$G_{LNA}\alpha C_2 \sqrt{1 - C_1^2}$$

is greater than 1, the circuit becomes an oscillator.

The maximum rejection of spurious signals ($R_{max}$) is maximum to minimum circuit gain $G_{cmax}/G_{cmin}$;

$$R_{max} = \frac{1 + G_{LNA}\alpha C_2 \sqrt{1 - C_1^2}}{1 - G_{LNA}\alpha C_2 \sqrt{1 - C_1^2}} \tag{8}$$

$$R_{min} = \frac{1 + G_{LNA}\alpha C_2 \sqrt{1 - C_1^2}}{1 - G_{LNA}\alpha C_2 \sqrt{1 - C_1^2}} \tag{9}$$

The following illustrates exemplary values for components in the ring to obtain a filter. Referring to FIG. 3:

| | | |
|---|---|---|
| Coupler #1 | = | 10.0 dB |
| Coupler #2 | = | 10.0 dB |
| Phase Shifter (32) Loss | = | 0.8 dB |
| Circuit Losses | = | 0.2 dB |
| $G_{LNA}$ | = | 12.5 dB |
| T/R Limiter (30) | = | 1.5 dB |

From equation (7) the circuit gain at resonance:

$$G_c = \frac{G_{LNA} C_1 \sqrt{1 - C_2^2}}{1 - [G_{LNA}\alpha C_2 \sqrt{1 - C_2^2}]}$$

$$C_1 = 10^{-\frac{10}{20}} = .3162$$

$$C_2 = 10^{-\frac{10}{20}} = .3162$$

-continued $$\alpha = 10^{-\frac{2.5}{20}} = .75$$

$$G_{LNA} = 10^{-\frac{12.5}{20}} = 4.22$$

$$\therefore G_c = \frac{(4.22)(.3162)(.949)}{1 - .945} = 23$$

$G_c(\text{dB}) = 20 \log 23 = 27.2 \text{ dB}$

Figure 5:
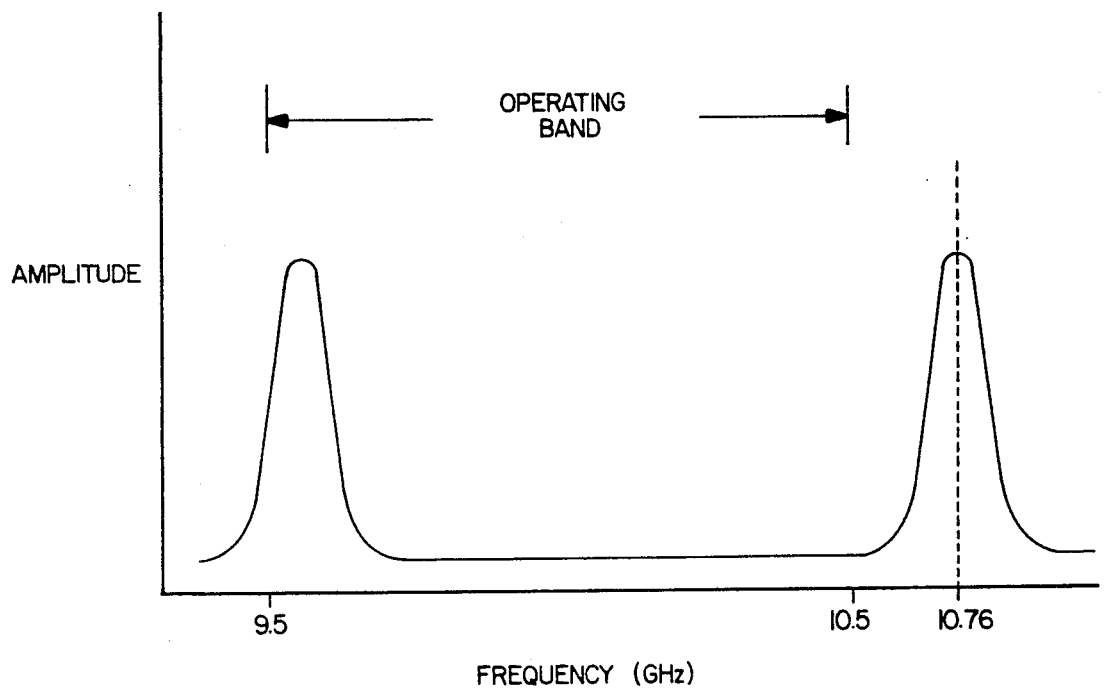
FIG. 5 is a graph of the primary and secondary resonances for a ring structure having an electrical length or insertion phase of 2700°.

The maximum rejection $R_{max} = \frac{G_{cmax}}{G_{cmin}} = \frac{1 + .945}{1 - .945} = 35.4$ $R_{max}(\text{dB}) = 20 \log 35.4 = 31 \text{ dB}$ As shown in equation (7), the phase shifter can be set so that resonance of the ring occurs at the desired frequency. As the frequency varies, $\beta 1$ varies and, therefore, a passband response occurs. As illustrated in the above example, a circuit gain of 27 dB can be obtained with the components selected and the maximum rejection obtained is 31 dB. Thus, a passband characteristic of a single tuned circuit of the nature depicted in FIG. 5 is obtained.

A more detailed illustration of the predicted passband characteristics of the example discussed above using equation (7) is shown in FIG. 10. The phase in the example was adjusted to center the filter passband at 10 GHz and also at 9.5 GHz.

Although monolithic microwave integrated circuit (MMIC) or microwave integrated circuit (MIC) implementation of the phase shifter could be used for size reduction, the presently preferred circuit described above utilizes a digital latching hybrid mode phase shifter of the nature disclosed in the U.S. Pat. No. 5,075,648 issued to Roberts et al on Dec. 24, 1991. The performance advantage of the hybrid mode phase shifter is that the insertion loss variation is extremely small with phase variation. Thus, the gain of the ring would be stable when tuned over the operating frequency range. Additionally, the hybrid mode phase shifter has the advantages of: being latchable thus requiring no holding power; requiring low switching energy; and it also has fast switching capability.

In addition to the above, PIN diode phase shifters may be used. Moreover, since the power is sufficiently low, varactor phasers may also be used.

As may be seen from a consideration of FIGS. 5 along with 8A-8C, our tunable filter will exhibit multiple passband responses depending upon the electrical length of the loop and the required operating bandwidth. That is to say, as the frequency changes, the electrical length of the loop changes; and when the frequency is changed such that the electrical length of the loop changes 360°, another resonance will occur. In order to determine the operating bandwidth for a single resonant response, various components were investigated in order to determine what the electrical length of the illustrated ring structure might be.

In this regard a 360° hybrid mode phase shifter of the nature referenced above has an insertion phase at 10 GHz of approximately 2000°. The coupler, T/R limiter and miscellaneous connecting line lengths can be maintained to approximately 500°. Moreover, low noise amplifiers having 200° or less of insertion phase are available. Thus, resonant ring structures having a total insertion phase of 2700° can be obtained.

Figure 10:
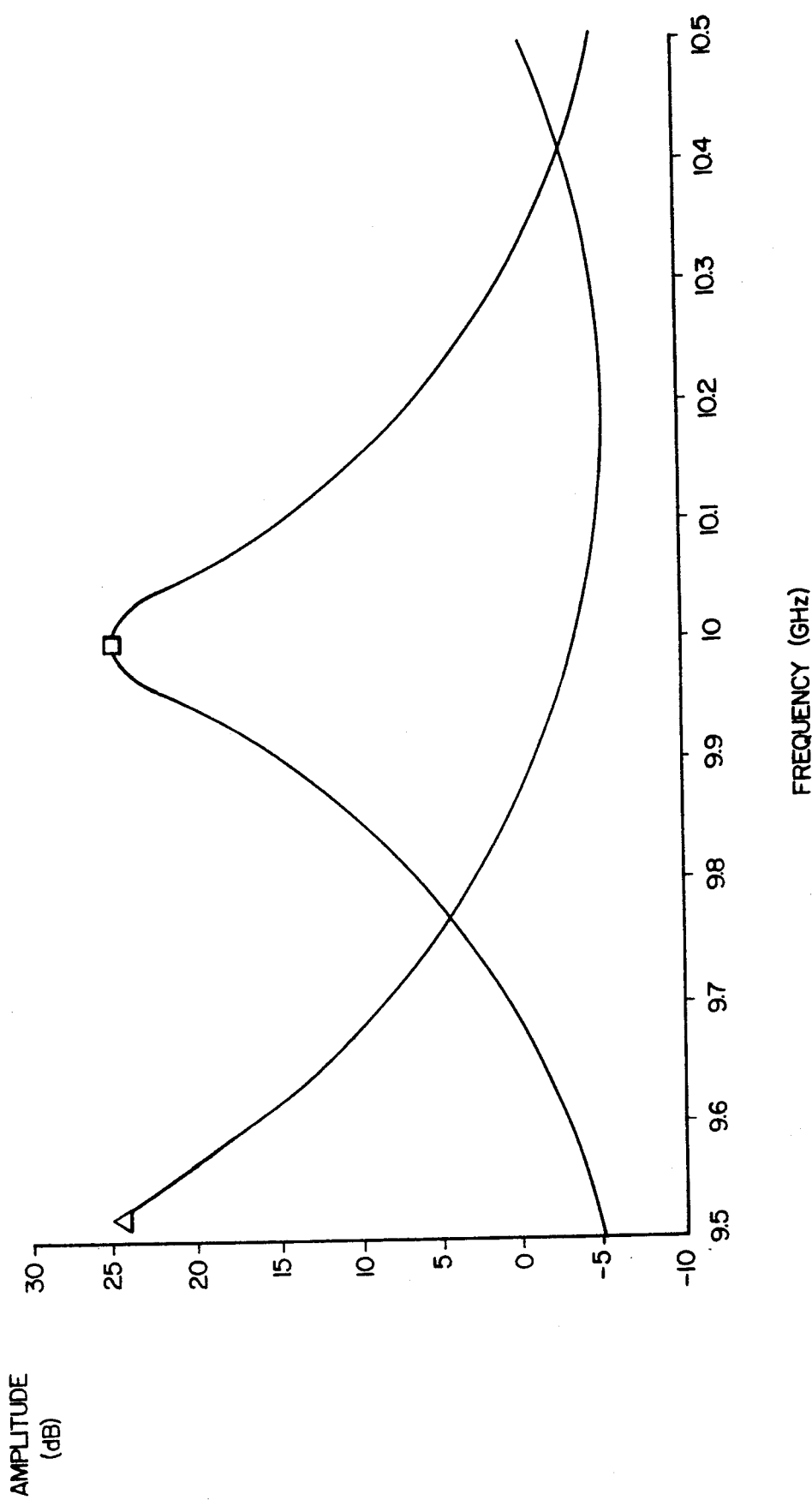
FIG. 10 shows predicted passband characteristics of a disclosed exemplary embodiment of the filter with the phase adjusted to center the filter passband at the 10 GHz and also at 9.5 GHz.

Under such circumstances, if the low end of the operating band is selected to be 9.5 GHz, then another resonance would occur at 9.5 GHz+9.5×360/2700 GHz=10.766 GHz. Thus, a single passband response could easily be obtained over the 9.5 to 10.5 GHz band, as illustrated in FIGS. 5 and 10, for example.

Figure 8A:
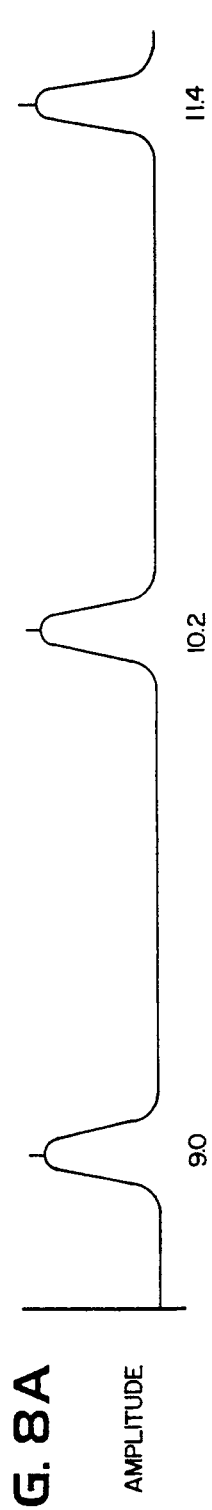
FIGS. 8A, 8B and 8C illustrate the separate filter responses of two filter stages having different resonant path lengths, as well as the combined response of the two tunable filters in a receive channel.
Figure 8B:
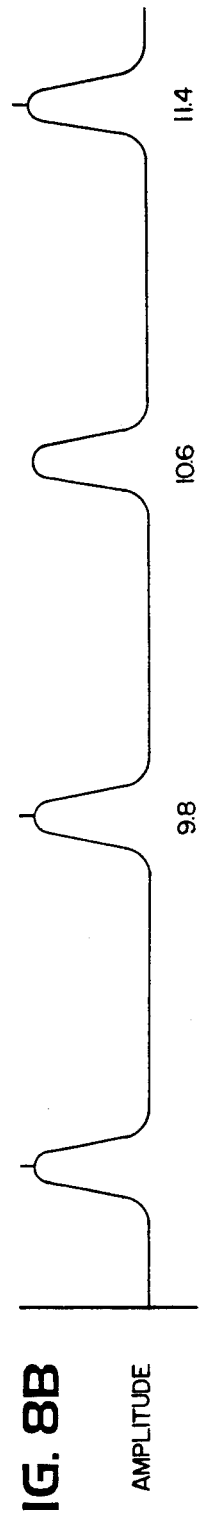
Figure 8C:
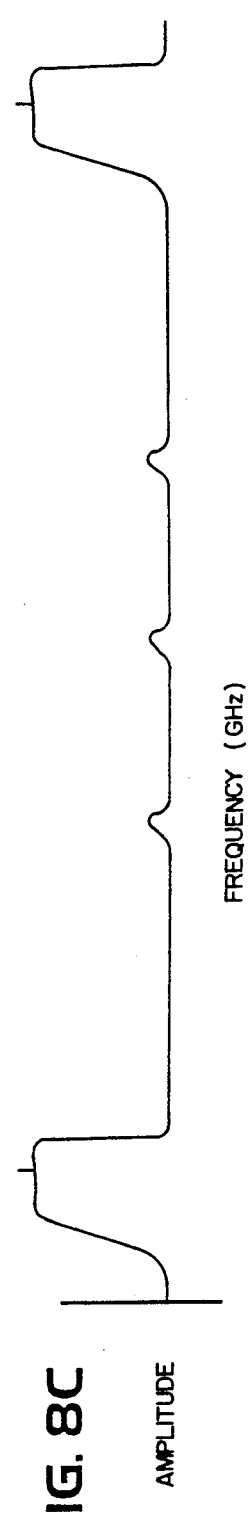

However, where larger operating bandwidths are required, and the electrical length of the ring cannot be reduced, other responses will obviously occur. As illustrated graphically in FIGS. 8A through 8C, we have discovered that such additional responses may be eliminated through the use of additional stages as in FIG. 6 in which the electrical length of the loop is different from that of the first stage. For example, the response of two filter sections or stages, each having appropriately selected elements and phase settings and each having different resonant path lengths may exhibit responses as illustrated in FIGS. 8A and 8B. The combined response, however, would be that as illustrated in FIG. 8C, wherein the larger operating bandwidth is evident.

Figure 6:
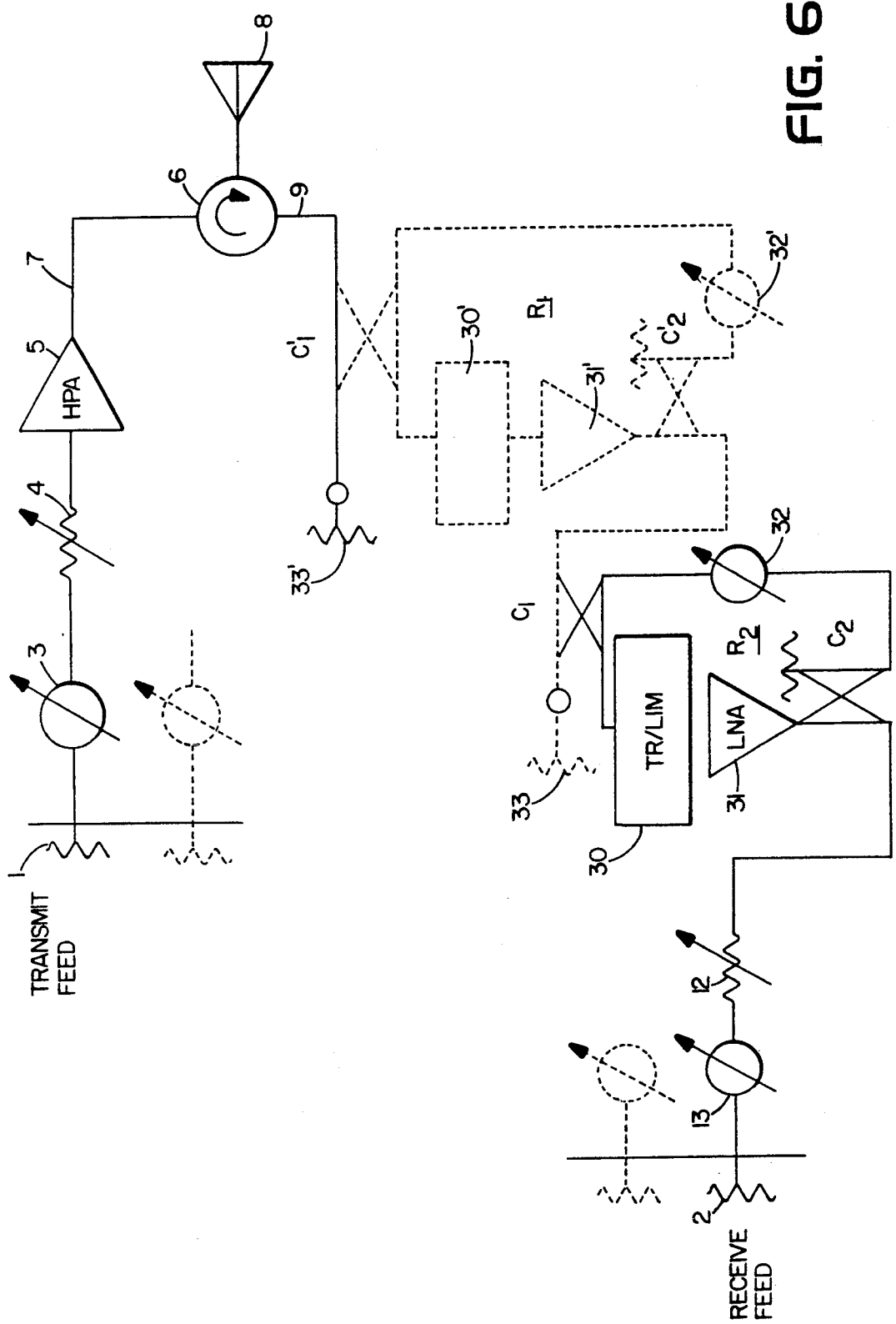
FIG. 6 is an exemplary schematic embodiment illustrating the use of one or more stages of a tunable bandpass filter as may be used in the receive channel of a T/R module of the nature illustrated in FIG. 1.

As previously indicated, the resonant ring filter structure of FIGS. 3 or 3A may be used to replace the low noise amplifier of FIG. 1 to obtain the bandpass filter characteristics for the desired operating bandwidth. FIG. 6 is illustrative of the improved T/R module as may be used with phased arrays to increase the dynamic range of the receiver channel. FIG. 6 is also illustrative of the manner in which the above noted additional resonant ring structure $R_1$ is incorporated for increasing the operating bandwidth. That is to say, the figure shows a two stage filter with both stage $R_1$, illustrated in dashed lines, and stage $R_2$ connected in series. For a single stage filter, stage $R_1$ would be eliminated and coupler $C_1$ of stage $R_2$ would be coupled to microstrip 9 in place of coupler $C'_1$ in the manner shown in FIGS. 3 and 6. As will be appreciated by the artisan, the ring filter structure of FIG. 3A also may be used in the general manner illustrated in FIG. 6. Elements common to those found in FIGS. 1, 3 and 3A have been used in FIG. 6 for identification purposes. Observations and advantages pertinent to the illustrated circuit of FIG. 6 are as follows:

1. A rejection of off-frequency spurious signals will occur due to the passband response of the filter. The third order intermodulation products are reduced by a factor of 3× the filter rejection.

Figure 9:
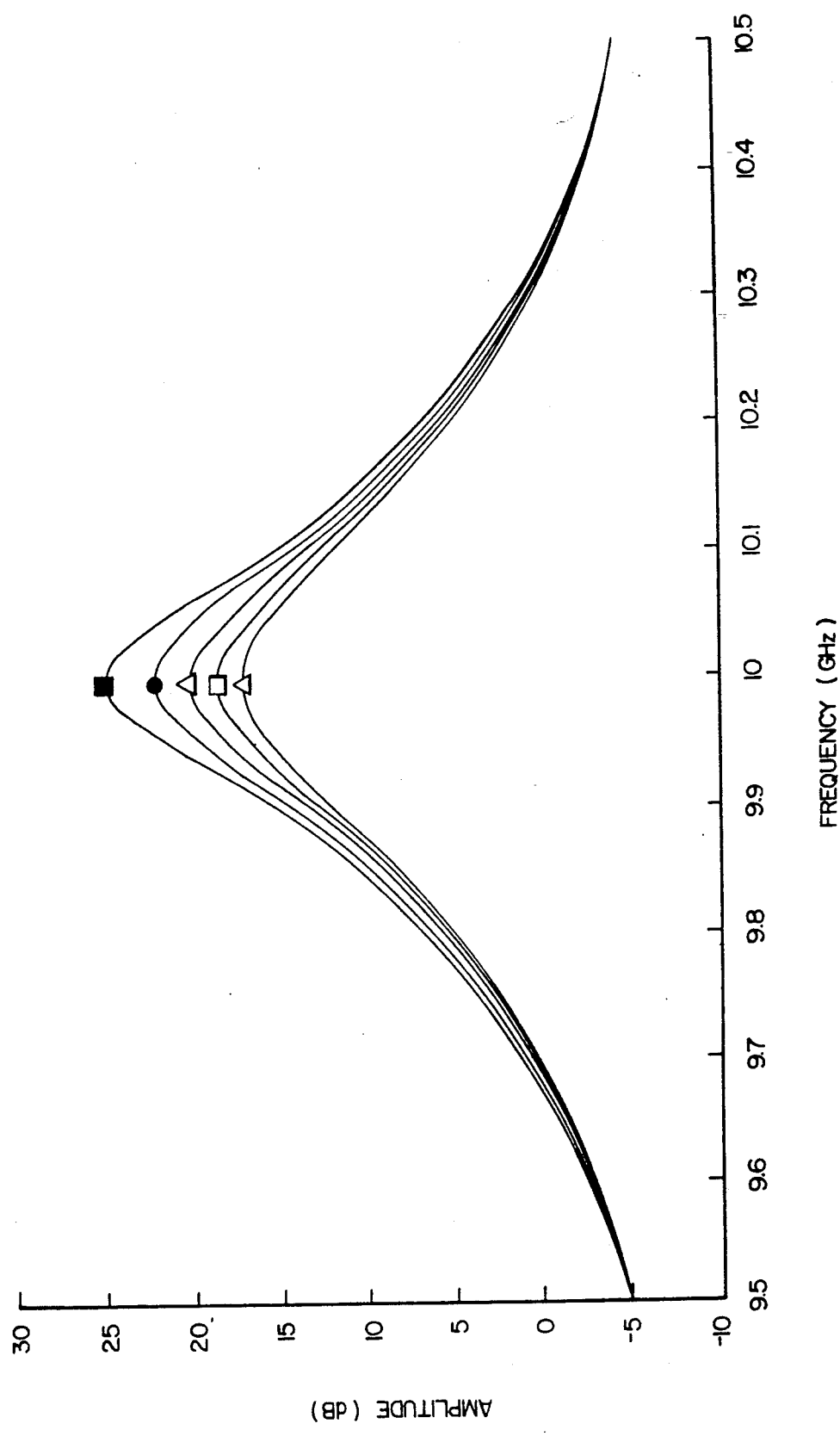
FIG. 9 is a is a graphical illustration of the manner in which filter gain can be adjusted by varying the insertion loss of the ring structure.

2. The gain of the circuit as illustrated in 0.2 dB increments as in FIG. 9 could be adjusted by varying the insertion loss of the ring.

3. The T/R limiter and LNA are placed in the ring, decoupled from the antenna and, therefore, do not present reflection problems. A spurious signal off frequency will be terminated in load 33 and, therefore, low and uniform reflection coefficients could be maintained for low radar cross section applications. The T/R limiter and LNA are also less susceptible to burn-out from spurious signals.

4. The ring can be de-tuned either with the phase shifter or the LNA to give further protection of the T/R limiter and LNA against the T/R module HPA during the transmit pulse.

5. For optimum signal to noise response the circuit shown in FIG. 3A would be utilized. The increase in noise figure over the LNA would only be approximately 0.2 dB with proper component selection. This is in contrast to much larger figures in competitive technologies involving other tunable filters such as Yttrium-Iron-Garnet (YIG) filters which are typically 2-3 dB.

6. The tunable filter, as described herein, has the capability of tuning very quickly with only a small amount of energy if a hybrid mode phase shifter is used to tune the circuit. For example, when operating in the X-band frequency range, tuning time to tune from any frequency in the operating band to any other frequency in the band, could be less than 1 μsec and would require less than 50 μjoules of energy to switch.

Figure 7:
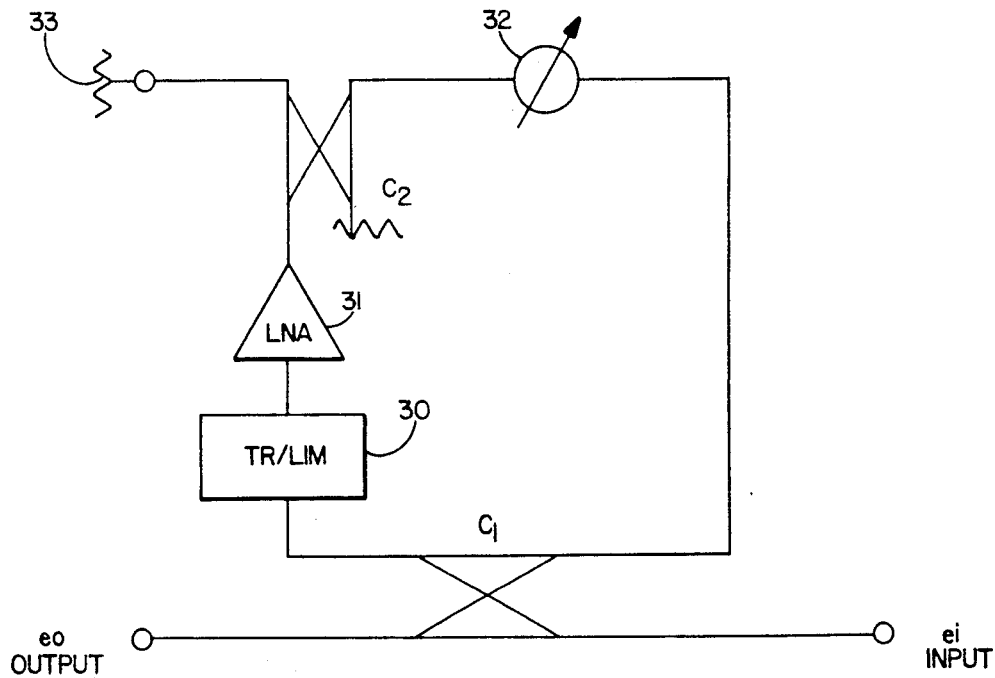
FIG. 7 is a schematic illustration of the disclosed tunable filter connected as a digital latching band rejection filter.

Additionally, if desired, the bandpass circuit of FIG. 3 may be reconnected in the manner illustrated in FIG. 7 to become a band rejection filter. That is to say, if the output port is chosen to be the port which is now loaded on coupler $C_1$, band rejection is obtained. As will be appreciated by the artisan, when operating the circuit of FIG. 7 at resonance, the power is reinforced in the ring and the power at the output port is reduced. Moreover, when the circuit is not resonant, the loss is limited to the coupling loss of the $C_1$ coupler.

Figure 11:
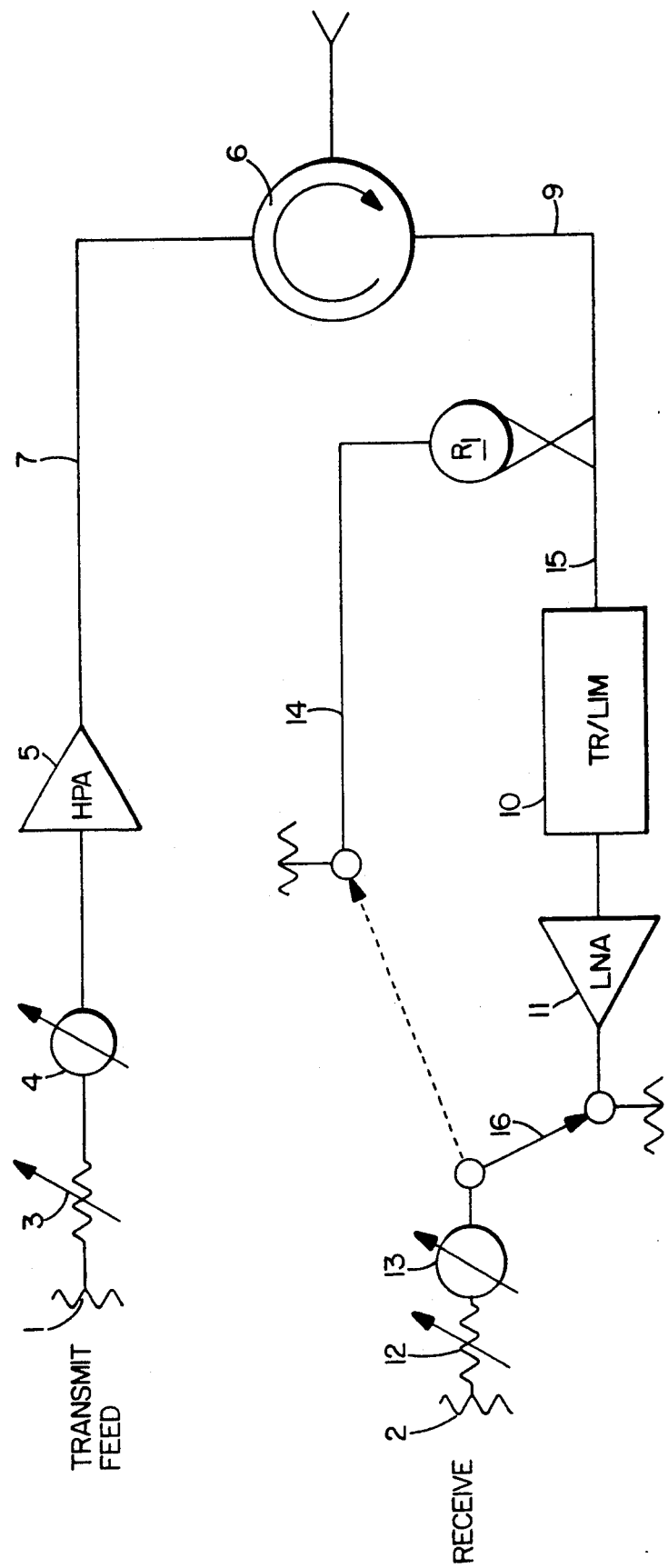
FIG. 11 schematically shows a further exemplary embodiment wherein the filter can be selectively activated in a spurious or spurious free environment to obtain broad and narrow filter passband responses over a selected bandwidth or a band rejection filter tuned for a selected spurious frequency.

FIG. 11 shows a further exemplary embodiment of a T/R module as in FIGS. 1 and 6 but modified to include two paths and a controllable integrated switch 16 wherein the filter $R_1$ can be selectively activated and used in either a spurious or spurious free environment. In a spurious free environment the receive channel switch 16, positioned as indicated by the solid line, would form a broad bandwidth path (8-12 GHz, for example) via lines 9 and 15. Under such conditions, the amplifier of the filter $R_1$ would be turned off. Thus, the loss to the T/R limiter for the broad bandwidth path would be limited to the coupler loss (0.45 dB for a 10 dB coupler, for example).

If spurious signals are present, however, the LNA of the filter would be energized and switch 16 switched to the dashed line position so that a filtered response over a limited bandwidth (9-11 GHz, for example) is obtained at receive port 2. Thus, the passband characteristic of the tuned active filter is coupled to the receive port. As will be appreciated by the artisan, the noted frequencies are merely exemplary and not limiting as to applicable frequency bands.

In addition to the above noted modes of operation, the T/R module of FIG. 11 is also operable in a broad band mode with simultaneous band rejection of spurious signals. For example, if the broad band channel operation is selected by positioning switch 16, as shown in the solid line position, and a single tone spurious is present, the active filter could be energized and a band rejection filter would exist similar to that shown in FIG. 7. With the resonance of the ring structure $R_1$ tuned to the single tone spurious, broad band reception with rejection of the spurious tone is achieved.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. A low-loss, fast switching tunable filter comprising:
   a resonant ring structure including an amplifier and a variable phase shifter for circulating an RF energy signal around said ring structure;
   a first coupling device for coupling an input RF energy signal to said ring structure wherein the input RF energy signal constructively interferes with the circulating RF signal at an input of said amplifier at resonance; and
   a second coupling device for coupling RF energy from said ring structure, wherein the gain of said amplifier is less than the coupling and circuit losses of said ring structure and said ring structure is tuned to resonate over an operating frequency bandwidth by varying the setting of said variable phase shifter.

2. A tunable filter as in claim 1 wherein said filter is a tunable bandpass filter.

3. A tunable filter as in claim 2 wherein said resonant ring structure has a total insertion phase such that a single passband response is obtained over said operating frequency bandwidth.

4. A tunable filter as in claim 1 wherein said filter is a tunable band rejection filter.

5. A tunable filter as in claims 1, 2 or 4 wherein said phase shifter is a latching hybrid mode phase shifter.

6. A tunable filter as in claims 1, 2 or 4 wherein said phase shifter is a PIN phase shifter.

7. A tunable filter as in claims 1, 2 or 4 wherein said resonant ring structure is microstrip compatible.

8. A tunable filter as in claims 1, 2 or 4 wherein said phase shifter is a varactor phaser.

9. A tunable filter as in claims 1, 2 or 4 wherein said phase shifter is implemented using microwave integrated circuits.

10. A tunable filter as in claims 1, 2 or 4 wherein said phase shifter is implemented using monolithic microwave integrated circuits.

11. A tunable filter as in claim 1 wherein said resonant ring structure is coupled via said first coupling device to the receive channel of a transmit/receive module for use in a phased array.

12. A tunable filter as in claim 11 wherein said phase shifter is a digital latching hybrid mode phase shifter.

13. A tunable filter as in claim 12 wherein said filter is a tunable bandpass filter for rejecting off-frequency spurious signals and increasing the dynamic range of said module receive channel.

14. A transmitter/receiver module for use in a phased array, said module comprising:
   receiver channel;
   a resonant ring structure coupled to said receiver channel by a first coupling element for coupling RF signals to said ring structure;
   said resonant ring structure further including a phase shifter having a variable setting, an amplifier and a second coupling element for coupling RF energy to a receiver port;
   said resonant ring structure forming a bandpass filter which is tunable over an operating frequency bandwidth by variation of said phase shifter setting,
   whereby third order intermodulation products of said amplifier are reduced and the dynamic range of said module receiver is increased.

15. A transmitter/receiver module as in claim 14 further comprising an additional resonant ring structure coupled to said receiver channel and said resonant ring structure, said additional resonant ring structure having a different electrical length than that of said resonant ring structure at the same frequency so that the operating bandwidth of said receiver is increased.

16. A transmitter/receiver module as in claims 14 or 15 wherein said phase shifter is variable in order to tune the resonant frequency of the ring structure.

17. A transmitter/receiver module as in claim 16 wherein said phase shifter is a digital latching hybrid mode phase shifter.

18. A transmitter/receiver module as in claim 16 wherein said phase shifter is a PIN diode phase shifter.

19. A transmitter/receiver module as in claims 14 or 15 wherein said amplifier is a low noise amplifier.

20. A transmitter/receiver module as in claims 14 or 15 wherein the gain of the amplifier is less than the coupling and circuit losses of said ring structure.

21. A transmitter/receiver module as in claim 14 or 15 wherein said ring structure is microstrip compatible.

22. A transmitter/receiver module as in claim 16 wherein said phase shifter is a varactor phaser.

23. A transmitter/receiver module as in claim 16 wherein said phase shifter is implemented using microwave integrated circuits.

24. A transmitter/receiver module as in claim 16 wherein the phase shifter is implemented using monolithic microwave integrated circuits.

25. A transmitter/receiver module as in claim 14 wherein said resonant ring structure has an electrical length over said operating frequency bandwidth such that a single passband response is obtained over said bandwidth.

26. A transmitter/receiver module as in claim 14 wherein said ring structure includes a transmit/receive limiter.

27. A transmitter/receiver module as in claim 14 further comprising a transmit channel which includes a high power amplifier.

28. A method of increasing the dynamic range of a receiver of a transmit/receive module in a phased array, said method comprising:
coupling RF electrical signals from a receive channel of said module to a resonant ring structure, said ring structure including an amplifier and a variable phase shifter, said ring structure being capable of producing a single passband response over an operating frequency bandwidth;
controlling said variable phase shifter to produce said single passband response over said bandwidth so that off-frequency spurious RF signals are rejected, and
coupling said passband response to an output port of said receiver channel so that the dynamic range of said receiver is increased.

29. A method as in claim 28 wherein said variable phase shifter is a digital latching phase shifter and the step of controlling said variable phase shifter includes digitally latching the phase shifter to cause said ring structure to resonate over said bandwidth.

30. A method as in claim 28 further comprising the step of coupling RF electrical signals from said receive channel to said resonant ring structure and to at least one additional ring structure having a different electrical length than said resonant ring structure so that the operating bandwidth of said receiver is increased.

31. A method as in claim 28 further comprising the step of de-tuning said resonant ring structure during the transmit pulse of said transmit/receive module.

* * * * *